United States Patent
Templin et al.

(10) Patent No.: US 6,863,578 B2
(45) Date of Patent: Mar. 8, 2005

(54) HOLDING ELEMENT FOR HOLDING A CARRIER BOARD

(75) Inventors: Frank Templin, Munich (DE); Hans-Peter Martin, Buchloe (DE); Karl Rehnelt, Munich (DE)

(73) Assignee: Tyco Electronics AMP GmbH, Bensheim (DE)

( * ) Notice: Subject to any disclaimer, the term of this patent is extended or adjusted under 35 U.S.C. 154(b) by 0 days.

(21) Appl. No.: 10/432,100

(22) PCT Filed: Nov. 16, 2001

(86) PCT No.: PCT/EP01/13271
§ 371 (c)(1),
(2), (4) Date: Sep. 15, 2003

(87) PCT Pub. No.: WO02/41453
PCT Pub. Date: May 23, 2002

(65) Prior Publication Data
US 2004/0072477 A1 Apr. 15, 2004

(30) Foreign Application Priority Data
Nov. 20, 2000 (DE) .......................... 100 57 460

(51) Int. Cl.⁷ ................................................ H01R 4/02
(52) U.S. Cl. .......................... 439/876; 439/886; 439/62
(58) Field of Search .................. 439/876, 83, 885–886, 439/62, 65–67

(56) References Cited

U.S. PATENT DOCUMENTS

| | | | |
|---|---|---|---|
| 2,782,389 A | * | 2/1957 | Sunko et al. ............... 439/683 |
| 4,029,374 A | * | 6/1977 | Nestor et al. ................. 439/74 |
| 4,061,405 A | | 12/1977 | Minter ......................... 339/17 |
| 4,486,066 A | | 12/1984 | Minter ........................ 339/176 |
| 4,639,057 A | | 1/1987 | Daum .......................... 339/17 |
| 4,815,979 A | * | 3/1989 | Porter ......................... 439/62 |
| 4,978,307 A | | 12/1990 | Billman et al. ............... 439/83 |
| 5,411,420 A | * | 5/1995 | Dennis ....................... 439/876 |
| 5,490,788 A | | 2/1996 | Mazzochette ................ 439/83 |
| 5,569,056 A | * | 10/1996 | Raimond .................... 439/876 |
| 6,295,726 B1 | * | 10/2001 | Maatta ........................ 29/827 |

FOREIGN PATENT DOCUMENTS

| | | | | |
|---|---|---|---|---|
| DE | 67 486 | 6/1969 | | |
| DE | 1927066 B2 | 9/1978 | ............ | H05K/1/14 |
| DE | 29521180 U1 | 11/1996 | ............ | H01R/4/64 |
| DE | 10057460 C1 | 8/2002 | ............ | H05K/7/14 |
| EP | 0840408 A2 | 5/1998 | ........... | H01R/23/70 |

* cited by examiner

Primary Examiner—Gary Paumen
Assistant Examiner—Edwin A. Leon

(57) ABSTRACT

A holding element with a holding clip for holding a carrier board is soldered freestanding to a printed circuit board (PCB). The holding element has first and second holding arms that extend from a supporting region and form a receiving region therebetween. The first holding arm is connected to a first leg and the second holding arm is connected to a second leg. The first and second legs each have a base in an end region. At least one of the legs has a curved surface in the region of the base so that the holding element can be soldered to the PCB. The holding element being made of a strip material, and the first and second holding arms each having an outward bend forming a transition into the first and second legs, respectively.

20 Claims, 3 Drawing Sheets

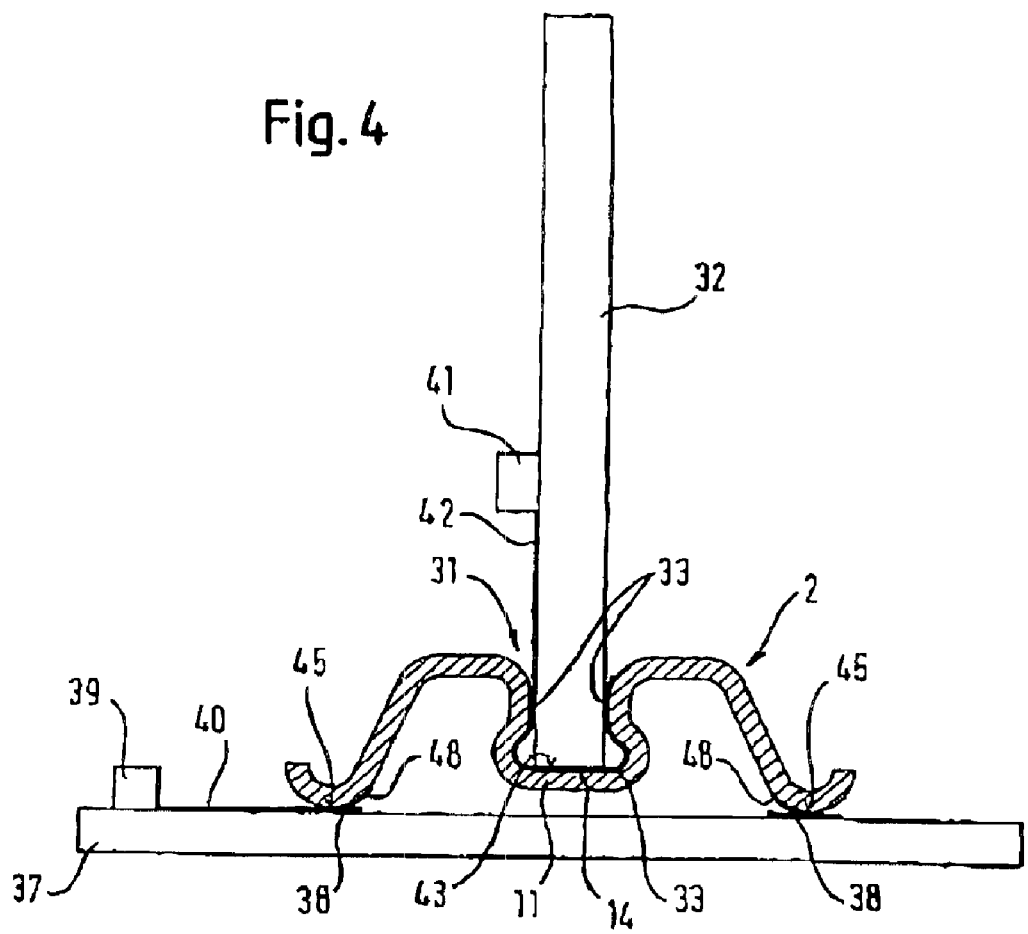
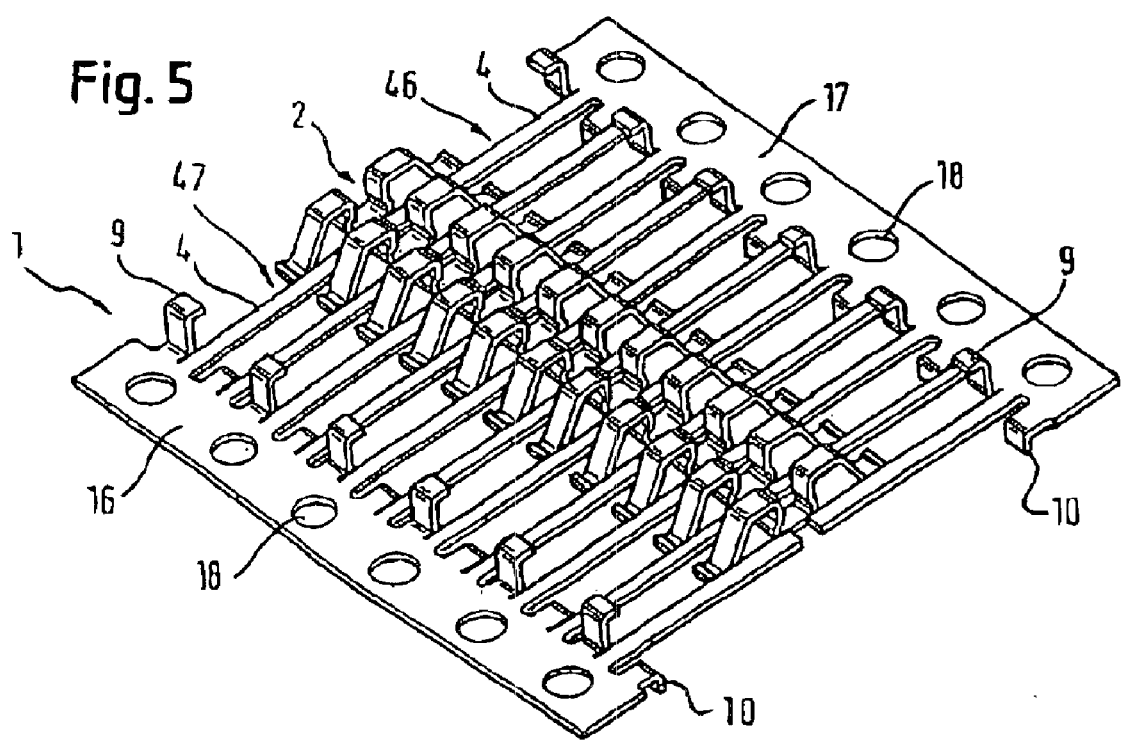

HOLDING ELEMENT FOR HOLDING A CARRIER BOARD

BACKGROUND OF THE INVENTION

1. Field of the Invention

The present invention relates to a holding element for holding a carrier board. More in particular, the present invention relates to a holding element having a holding clip with a first and a second holding arm, wherein the holding arms extend from a supporting region and between the holding arms a receiving region is formed, wherein the first holding arm is connected to a first leg and the second holding arm is connected to a second leg, said legs each having a base in an end region. The present invention further relates to a arrangement with a carrier board and a holding element, and an arrangement with a holding element and a carrier strip.

2. Summary of the Prior Art

Holding elements are used in electronic circuits to hold a printed circuit board and preferably at the same time to establish an electrical contact between the printed circuit board and a base board. In this connection, the holding element is preferably soldered to the base-board and the printed circuit board is inserted into a receiving region of the holding element.

U.S. Pat. No. 4,486,066 discloses a holding element, which comprises a holding clip with two holding arms, the holding arms extending from a central supporting region. The holding arms are bent round at a given distance from the supporting region and are taken with end portions to below the level of the supporting region. The end portions of the holding arms are of linear construction and are pushed through contact holes of a first printed circuit board and then soldered to the first printed circuit board. After soldering the holding arms, a further printed circuit board can be pushed into the U-shaped receiving region between the holding arms. The further printed circuit board is held by the holding arms and at the same time electrically connected via the electrically conductive holding element to conductors that are arranged on the first printed circuit board.

U.S. Pat. No. 4,061,405 discloses a device for handling holding elements, in which the holding elements are in the form of U-shaped holding clips having two holding arms. Starting from a central supporting region, the holding arms are bent round at a given distance from the supporting region and extend with the ends of the holding arms to below the level of the supporting region. The holding clip is in the form of a bent wire. A carrying rail with receiving openings is provided for transportation of a plurality of holding clips. The carrying rail is pushed from above onto a given number of holding clips arranged in a row. In the process, two holding arms of a holding clip are gripped by opposing regions of the carrying rail. In addition, on the carrying rail there is formed a central member, which is introduced into the receiving region of the holding clip. By biasing the holding arms towards the receiving region, the central member is firmly clamped by the holding clips, thus rendering possible transportation of the holding clips during which the holding clips maintain their position in the row.

U.S. Pat. No. 4,978,307 discloses an electrical base for substrates, in which the electrical base has a holding clip with two holding arms. The two holding arms start from a central supporting region and define a receiving region. A first holding arm is bent round at a given distance from the central supporting region and joined to a first leg. The first leg is guided towards the supporting region and has a planar contact area with which the holding element is soldered to a printed circuit board. The second holding arm is joined to a carrier strip, one carrier strip being joined to a plurality of holding elements. After soldering up the holding elements and breaking the carrier strip away from the second holding arm, a substrate is inserted into the receiving region. The substrate is fixedly held by the holding arms and at the same time electrically connected with the printed circuit board via the holding arms and the first leg.

The holding element described has only one leg, so that before insertion of the substrate the holding element must first be fixedly soldered to a printed circuit board and only then can the carrier strip be broken away. Manipulation of the holding element is therefore relatively awkward.

The problem underlying the invention consists in providing a holding element having a holding clip, an arrangement with a carrier board and a holding element, and an arrangement with a holding element and a carrier strip, thereby permitting simpler manipulation of the holding element when it is being joined to the printed circuit board or being fastened to a carrier board.

SUMMARY OF THE INVENTION

The problem of the invention is solved by a holding element characterised in that the holding element is made of a strip material and in that the first and second holding arms each have an outward bend forming a transition into the first and second leg respectively.

Further advantageous embodiments of the invention are specified in the dependent claims.

One advantage of the holding element consists in that the first and the second leg each have a base in an end region. By virtue of the arrangement of two legs with bases, the holding element stands stably on a printed circuit board and can consequently be soldered up to a printed circuit board without further fixing means. In addition, even with an inserted carrier board, the holding element stands stably on a printed circuit board. This offers the advantage that a pre-assembled component comprising the holding element and a carrier board can be produced and sold as a supplied part. The pre-assembled component can be connected with a printed circuit board in a simple manner by placing the component on the printed circuit board and soldering it up free-standing without further support to the printed circuit board.

The first and/or the second leg has a curved surface in the region of its base. The curved surface offers the advantage that the leg rests on a printed circuit board virtually with a one-dimensional surface. In this way, tilting of the holding element in the lengthwise direction of the holding element is automatically avoided. Moreover, the curved surface offers the advantage that when soldering up the printed circuit board, the heated solder finds a defined angle of flow and hence the heated solder reliably wets the leg. This improves the soldering result.

The outward bend forming the transition between each holding arm and its associated leg provides an advantageous shape having resilience. This resilience facilitates the insertion of a carrier plate.

A symmetrical construction of the first and the second leg is especially advantageous. A precise position of the receiving region is consequently defined, and a carrier board inserted in the receiving region is likewise precisely aligned with respect to the position of the bases.

Moreover, by the use of two legs, thermally different coefficients of expansion between a printed circuit board and the holding element can be better equalised. Compressive stresses are also better cushioned.

In a preferred embodiment, the holding element is produced from band or strip material by a bending process. Owing to the bending process, an inexpensive manufactur of the holding element is possible.

The curvature is preferably formed only along the longitudinal axis of a leg, so that the leg is in the form of a curved strip.

In a preferred embodiment, the holding arms are arranged a given distance apart from one another and are biased to prevent outward bending. In this way, a carrier board that is pushed into the receiving region, and in the process presses the holding arms outwards, is reliably retained by the holding element. The carrier board and the holding element can therefore be transported or stored before the carrier board is soldered up with the holding element, which means that manufacture can be more flexible.

The construction of the central supporting region as a virtually flat surface is especially advantageous. The provision of a virtually flat surface enables a carrier board, which also has a flat side edge, to be placed with its flat side edge on the supporting region. Because the surfaces that lie one on top of the other are plane, the carrier board is securely held in a given position by the holding arms. Lateral tilting is therefore rendered more difficult.

In a further advantageous embodiment, a first solder layer is applied to the supporting region of the holding element. The first solder layer is advantageously used for joining to the carrier board.

A preferred choice of material for the holding element comprises a copper alloy, which is covered at least partly with a layer of tin. The copper alloy is relatively robust and at the selected dimensions offers satisfactory security against breaking and furthermore the necessary resilience for the holding arms. The tin layer offers the advantage of a simple solder layer join and is furthermore environmentally acceptable, since it contains no lead.

A further advantageous construction of the holding element is achieved in that the lower edge of the central supporting region is arranged above a straight connecting line that runs between the bases of the legs of a holding element. In this way, when the holding element is positioned with its legs on a printed circuit board, it can be ensued that the holding element rests with a first and second base on the printed circuit board and resiliency of the carrier board is ensured.

A preferred radius for the curvature of the base lies within the range from 0.3 to 0.7 mm. For this radius range, especially advantageous flow conditions for the solder were ascertained.

A further advantageous embodiment of the invention consists in that at least part of the central supporting region across the entire width of the holding element is manufactured from an insulating material. The insulating connecting piece electrically isolates the two legs of a holding element from one another, thus providing the opportunity for the printed circuit board to be connected via a single holding element to two contacts of different voltage.

The holding element described offers the advantage that an arrangement comprising a carrier board and at least one holding element can be pre-assembled and on account of the stability of the holding element is set up on a printed circuit board in a separate production step and only then soldered to the printed circuit board. A pre-assembled component consisting of at least one holding element and a carrier board can therefore be sold.

An advantage of an arrangement with a holding element and a carrier strip that are integrally constructed from a strip material consists in that the carrier strip has ties that are arranged side by side, the ties have a given lateral spacing from one another and a holding element is arranged between two ties. This arrangement has the advantage that the holding elements are held firmly by the ties. Moreover, a relatively large amount of material of the sheet is available in the form of a strip for the construction of the holding element. By virtue of the long strip, the holding element can be formed with two relatively long legs, without the material thickens of the holding element being reduced. The holding element is therefore of relatively stable construction.

In a preferred embodiment, the carrier strip comprises a first and a second row of ties, the ties of the two rows being arranged symmetrically with respect to and opposite one another. In this embodiment, a holding element is connected to a tie of each of the first and second row. The arrangement of the ties and the holding elements produces a stable retention of the holding element in the carrier strip. The arrangement comprising holding element and carrier strip is therefore relatively robust and not affected by mechanical influences.

In a further preferred embodiment, the carrier strip has at least one spacer, which is preferably taken further upwards or downwards than the holding element extends upwards or downwards from the carrier strip. This embodiment offers the advantage that the arrangement comprising carrier strip and holding elements can be transported in the form of an endless band rolled up on a reel, release strips being provided between the individual layers of the carrier strip. By virtue of the spacers, however, the carrier strips rest against the release strips only with the spaces, so that the holding elements are protected from damage.

The spacers are preferably formed on the carrier strip between two ties, and preferably lie on one axis with a holding element. The existing material of the sheet can in this way be utilised at the same time to produce the spacers. Moreover, the spacers are preferably arranged on opposing sides of a holding element, so that the holding element is well protected.

In a preferred embodiment, the spacers, which are arranged in a row on one side of the carrier strip, are constructed alternately upwards and downwards. This ensures that the holding elements are reliably protected.

BRIEF DESCRIPTION OF THE DRAWINGS

FIG. 4 shows a holding element with carrier board,

FIG. 5 is a perspective view of a carrier strip with a plurality of holding elements.

DETAILED DESCRIPTION OF THE PREFERRED EMBODIMENT

Figure 1:
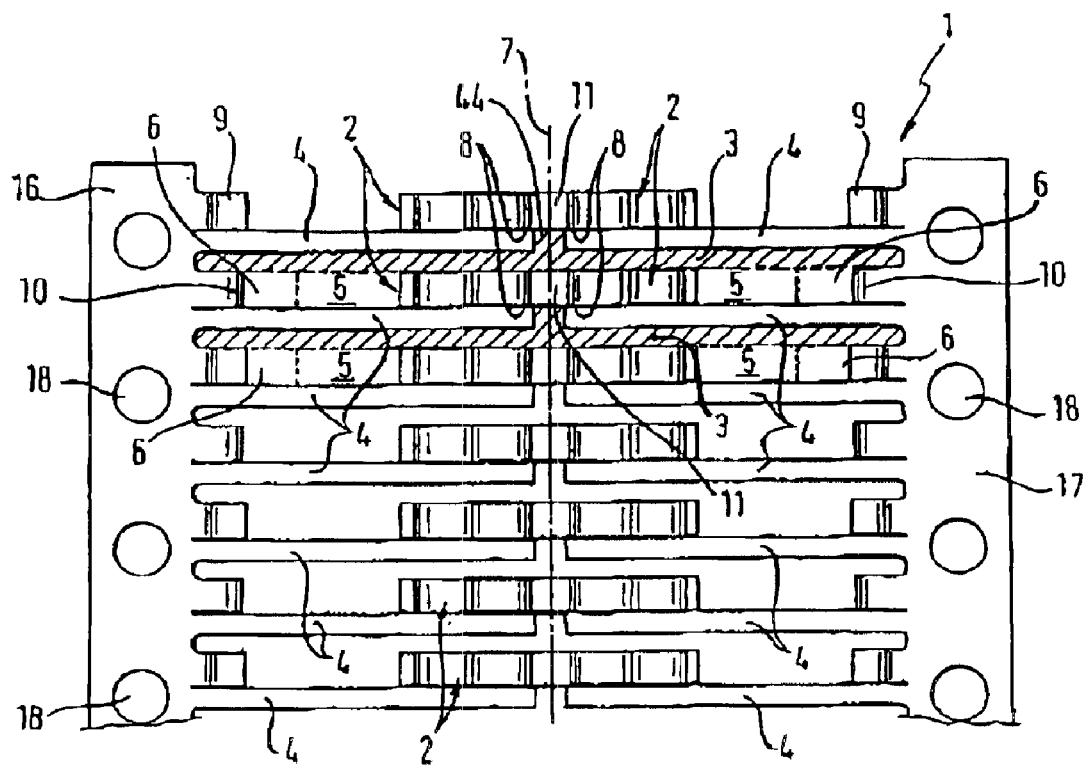
FIG. 1 shows a carrier strip and holding elements in the form of a band.

FIG. 1 shows merely by way of non-limiting example a carrier strip 1 with a plurality of holding elements 2. The carrier strip 1 and the holding elements 2 are integrally formed from a strip material. The strip has a given width of 10 to 30 mm, a given thickness of 0.1 to 0.6 mm and any desired length. During manufacture, to begin with fist stamped regions 3 are stamped out, these regions are in strip form and define ties 4, a holding strip 5 and two spacer strips 6. The first stamped area 3 is shown by a broken line. The first stamped area 3 is arranged substantially in the form of an elongate strip symmetrically with respect to a centre line 7, and is taken via a rectangular recess 44 in the region of the centre line 7 upwards as far as the adjacent holding strip 5. In this way, two opposing ties 4 are defined. A holding strip 5 is joined laterally by way of a respective connecting area 8 with a right and a left tie 4. The two connecting areas 8 are each arranged laterally offset by a given spacing from the centre line 7. The centre line 7 runs through the middle of a supporting region 11.

The holding strip 5 and the space strips 6 lie on a straight line and are preferably the same width. Each of the two spacer strips 6 is associated with a respective end of the holding strip 5.

The holding strip 5 is re-shaped in a subsequent forming process into a holding element 2. The spacer strip 6 is re-shaped in a subsequently forming process into an upper spacer 9 or a lower spacer 10. Appropriate forming tools are used for the forming process.

The carrier strip 1 comprises a first and a second lateral strip 16, 17, to which the ties 4 and the spacers 9, 10 are fastened. Feed holes 18 are made in the first and second lateral strips 16, 17, in which advancing pawls engage when conveying the carrier strip 1 to a manufacturing arrangement. The first and the second lateral strips 16, 17 are each integrally connected with a spacer strip 6, the spacer strips 6 being associated with a holding strip 5.

Figure 2:
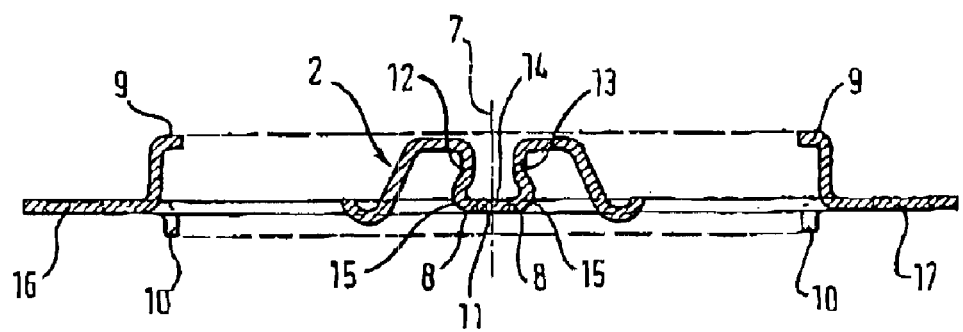
FIG. 2 shows a cross-section through a holding element and a carrier strip.

FIG. 2 shows a diagrammatic cross-section through the carrier strip 1 and a holding element 2. During the shaping process for the holding element 2, care is taken that the central supporting region 11 substantially retains the unchanged plane face of the sheet-form band, from which the carrier strip 1 and the holding elements 2 are formed. A plane face 14 is therefore available without any special processing steps. Starting from the central supporting region 11, two upwardly extending holding arms 12, 13 are shaped. The first and the second holding arm 12, 13 extend from the plane face 14 of the middle supporting region 11 and are bent upwards and inwards in a first bend 15 mirror-symmetrically with respect to the centre line 7. It is clearly apparent from this view that the lower spacer 10 extends further downwards from the carrier 1 than the holding element 2. The upper spacers 9 extend analogously further upwards away from the carrier strip 1 than the holding element 2. In this way, the space that the holding element 2 occupies above and below the carrier strip 1 is safely guarded by the upper and the lower spacers 9, 10 respectively. Normally, carrier strips 1 with holding elements 2 are stored and transported in the form of a band, a spacer layer in the form of a paper strip being inserted between the individual layers of band. In this connection, the paper strip lies against an upper spacer 9 of a lower carrier strip 1 and against a lower spacer 10 of an upper carrier strip 1. The holding elements 2 are reliably protected in this way against damage.

Referring to FIG. 2, the connecting areas 8 by means of which a tie 4 is joined to a holding element 2 are also recognisable. The connecting areas 8 are taken across the entire thickness of the central supporting region 11 and have only a small width of <1 mm. This small, two-dimensional connection enables the holding element 2 to be separated from the carrier strip 1 with little force and without damage by being bent through 90°.

Figure 3:
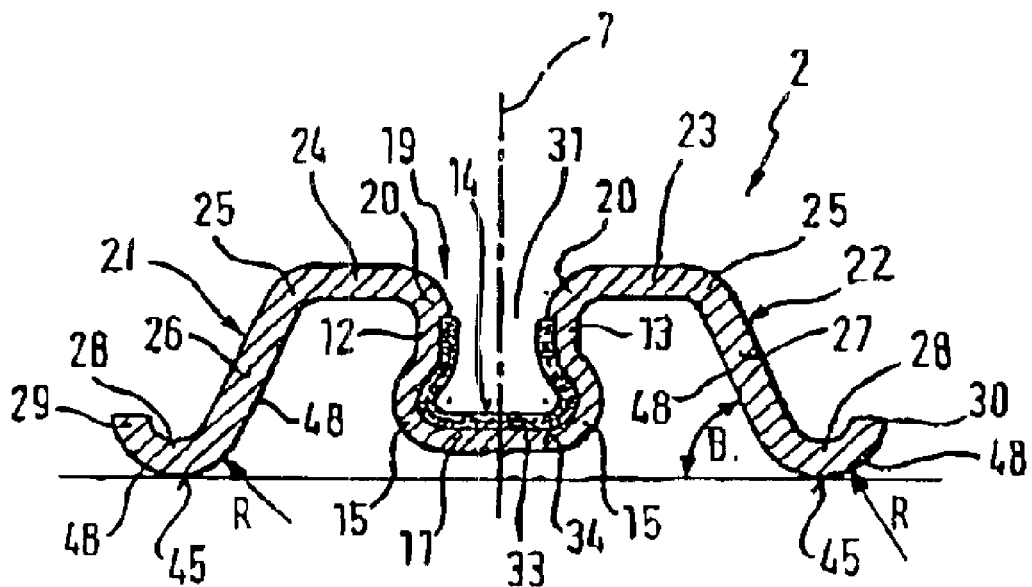
FIG. 3 shows a cross-section through a holding element to an enlarged scale.

The exact construction of the holding element 2 is explained in detail with reference to the following FIG. 3. After the shaping process and separation of the holding element 2 from the carrier strip 1, the holding element 2 is in the form illustrated in FIG. 3. The holding element 2 comprises a holding clip 19, which comprises the central supporting region 11 and the first and second holding arms 12, 13 adjoining the same. By virtue of the U-shaped construction of the holding clip 19, a receiving region 31 that is suitable for receiving a carrier board 32 (FIG. 4) is formed.

The first and the second holding arm 12, 13 converge following the first bead 15 to a given minimal distance apart, and each then bends outwards again into a second bend 20. After the second bead 20, the first and the second holding arm 12,13 merge into a first and second leg 21, 22 respectively. The first and the second leg 21, 22 have a first and second portion 23, 24 respectively, which is guided approximately parallel to the central supporting region 11. The first and the second portion 23, 24 merge by way of a third bend 25 into a third and fourth portion 26, 27 respectively. The third and fourth portion 26, 27 is taken to a level below the central supporting region 11 and merges by way of a fourth bend 28 into a first and second end portion 29, 30 respectively. The underside of the fourth bend 28 preferably has a radius R in the range between 0.3 and 0.8 mm. The fourth bend 28 is arranged in the first and in the second leg 21, 22 in such a way that an underside of the central supporting region 11 lies above a connecting in between the fourth bends 28 of the first and the second leg 21, 22. The third and the fourth portions 26, 27 are in the form of straight portions and form an angle B of less than 90° with the plane of the supporting region 11. The first and the second legs 21, 22 are preferably arranged mirror-symmetrically with respect to the centre line 7.

By virtue of the fourth bend 28, when placed on a printed circuit board the holding element 2 lies thereon with a linear base 45, so that tilting in the longitudinal direction of the holding element 2 is avoided. Furthermore, tilting in the transverse direction is made more difficult.

In a preferred embodiment, a solder layer 33 is applied to the central supporting region 11. In a further special embodiment solder 33 is applied to the surface of the first and second holding arms 12, 13 and of the supporting region 11 that are associated with the receiving region 31. In a preferred embodiment, the solder layer is introduced into a recess 34 formed in the holding arms 12, 13 and the supporting region 11. If the recess 34 is used, the recess 34 is filled with solder plane-parallel to the surface of the holding arms and of the central supporting region 11. Once a carrier board 32 (FIG. 4) has been inserted, the solder layer 33 or the solder is heated and in this way the carrier board 32 is fixedly joined to the holding element 2.

FIG. 4 shows an arrangement of a holding element 2, into the receiving region 31 of which a carrier board 32 has been partly inserted. Once the carrier board 32 has been inserted into the receiving region 31, the ties 4 can be broken away from the holding element 2 and the resulting two parts cam be pulled away laterally with the first and second lateral strips 16, 17. A simple detachment and removal of the carrier strip 1 is therefore possible in this manner.

In a preferred embodiment, the carrier strip 1 is not removed until after the holding element 2 has been soldered onto the carrier board 32.

Separation of the ties 4 from the central supporting region 11 is effected, for example, by pressing the ties 4 downwards. To do this, a comb-like pressure tool, for example, is used, which lies with corresponding knock-out pins on the ties 4 and presses the ties 4 downwards and breaks them away from the holding elements 2.

The pre-fabricated component comprising holding element 2 and carrier board 32 is subsequently placed with the bases 45 on solder areas 38 of a baseboard 37 and soldered.

The base-board 37 is in the form, for example, of a printed circuit board with electronic circuits 39 that are connected to the solder areas 38 by a strip conductor 40. Since the holding elements 2 are manufactured from an electrically conductive material, an electrical connection between the electronic circuit 39 of the base-board 37 and a second electronic circuit 41 that is applied to the carrier board 32 is produced by way of the holding elements 2. The second electronic circuit 41 is connected with the holding element 2 so as to be electrically conductive by way of a second strip conductor 42. The carrier board 32 can be in the form, for example, of ceramics or in the form of a printed circuit board or can be made of other materials.

The carrier board 32 preferably has a side edge 43 that is of plane construction and is associated with the plane face 14 of the supporting region 11. By virtue of the plane construction of the side edge 43 and the plane face 14, a relatively stable retention of the carrier board 32 in the holding element 2 is achieved. This counteracts lateral tilting of the carrier board 32. The curvature of the base 45 is arranged in the longitudinal axis of the third and fourth parts 26, 27, which are formed perpendicular to the direction of curvature as a flat surface.

The holding element is preferably manufactured from a copper alloy, the surface of the holding element being coated at least partly with a tin layer 48. In particular the bases 45 are coated with tin. The tin layer 48 facilitates solder to a solder layer.

FIG. 5 shows a perspective view of the carrier strip 1 and the holding elements 2. It is clearly apparent that in each case an upper and a lower spacer 9, 10 are aligned in a row on the first and second side strips 16, 17 respectively, and that in each case two spacers 9, 10 arranged side by side are oriented alternatively upwards and downwards. The alternation between an upper and a lower spacer 9, 10 means that the holding elements 2 are shielded relatively well with respect to an intermediate layer.

By the arrangement of two opposing rows 46, 47 of ties 4, the two parts resulting from detachment of the ties 4 from the holding elements 2 can be removed by pulling away the two parts laterally outwards. It is therefore possible for example, to insert the carrier board 32 in the holding elements 2 and to solder it fixedly to the holding elements even before the carrier strip 1 has been detached from the holding elements 2. Furthermore, the arrangement of the ties 4 at the same level as the central supporting region 11 has the advantage that the receiving region 31 is not covered by ties 4. A carrier board 32 can therefore be inserted into the receiving region 31 without being obstructed by ties 4.

The arrangement of carrier strip 1 with ties 4 and holding elements 2 connected therewith illustrated in FIGS. 1, 2 and 5 enables the area provided by the strip material from which the carrier strip 1 and the holding elements 2 are formed to be efficiently utilised. At a fixed width of the carrier strip 1, the holding elements 2 have relatively long first and second holding arms 12, 13 and first and second legs 21, 22 of relatively thick material. The holding element 2 preferably has a material thickness that corresponds to the thickness of the strip material. This is possible because a relatively long strip of material of the original strip material is used to produce the holding elements 2. The material present is therefore efficiently utilised.

The described arrangement furthermore offers the advantage that the carrier strip 1 and the holding elements 2 can be formed by simple punching and stamping processes from a flat sheet-form strip material. In this way, a simple and cost-efficient manufacture of the holding elements 2 and the carrier strip 1 is possible.

Figure 6:
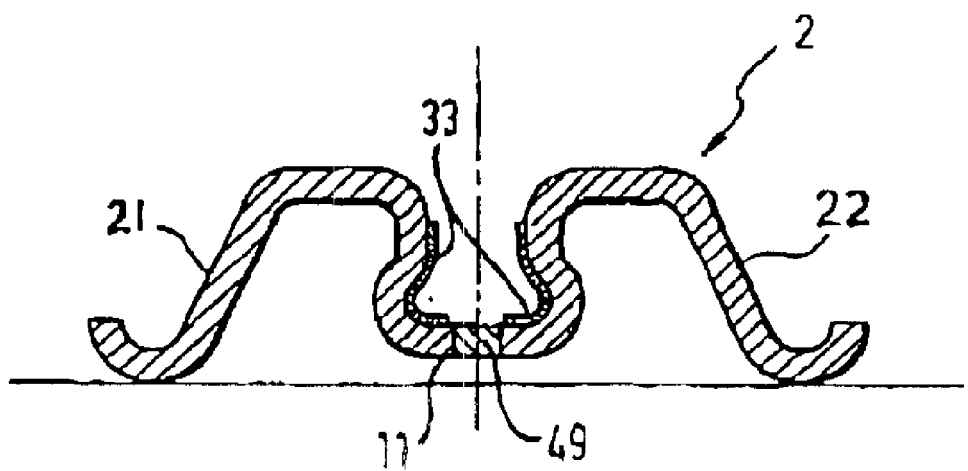
FIG. 6 shows a holding element with connecting piece.

Furthermore, the strip-form of the holding 2, resulting from the fact that the holding element 2 has a clearly larger width than material thickness, is clearly apparent from FIG. 5. The material thickness lies in the range from 0.1 to 0.6 mm. FIG. 6 shows a preferred embodiment, which the supporting surface 11 has an insulating connecting piece 49, which divides the holding element 2 into two electrically separate parts. In this embodiment, the solder layer 33 for the two parts is also formed in separate parts. This offers the advantage that a carrier board 32 can be supplied via a holding element 2 with two different voltages.

It will be understood by those skilled in the art that the present invention is not limited to the embodiments shown and that many additions and modifications are possible without departing from the scope of the present invention as defined in the appending claims.

We claim:

1. A holding element for soldering freestanding to a printed circuit board (PCB), comprising:
   first and second holding arms that extend from a supporting region and form a receiving region therebetween, the first holding arm being connected to a first leg and the second holding arm being connected to a second leg, the first and second legs each having a base in an end region, and a curved surface in a region of the base for surface-mount soldering the holding element to the PCB, an underside of the supporting region being arranged above a straight connecting line that runs between the bases of the first and second legs of the holding element, the holding element being made of a strip material, and the first and second holding arms each having an outward bend forming a transition into the first and second legs, respectively.

2. The holding element according to claim 1, wherein the first and the second legs are of symmetrical construction.

3. The holding element according to claim 1, wherein the holding element is manufactured from a plane band by a shaping process.

4. The holding element according to claim 1, wherein the first and second holding arms are arranged at a given distance apart and the first and second holding arms are biased against outward bending.

5. The holding element according to claim 1, wherein the supporting region is in the form at least partly of a virtually flat surface.

6. The holding element according to claim 1, further comprising a solder layer arranged on the supporting region.

7. The holding element according to claim 1, wherein the holding element consists of a copper alloy and the holding element is covered at least partly by a tin layer.

8. The holding element according to claim 1, wherein at least part of the supporting region across the entire width is manufactured from an insulating material.

9. The holding element according to claim 1, wherein the curved surface is arranged in a longitudinal axis of one of the legs.

10. The holding element according to claim 9, wherein the curved surface of the base has a radius between 0.3 mm and 0.7 mm.

11. The holding element according to claim 1, further comprising a carrier board arranged in the receiving region of the holding element.

12. The holding element according to claim 11, wherein the supporting region has a virtually flat supporting surface and the carrier board lies with a flat side face on the virtually flat supporting region of the holding element.

13. The holding element according to claim 11, wherein the carrier board is connected by way of a solder layer with the supporting face or with at least one of the holding arms.

14. An arrangement with a holding element for soldering free standing to a printed circuit board (PCB) and a carrier strip, comprising:
the holding element being integrally formed with the carrier strip, the carrier strip having ties that are arranged side by side, with ends that are closely adjacent to one another and the holding element is arranged between two adjacent ties.

15. The arrangement according to claim 14, wherein the holding element includes a holding clip with a receiving region, the receiving region is bounded by a planar supporting region, and the holding element is connected in a region of the planar supporting region with the carrier strip.

16. The arrangement according to claim 14, wherein the ties are arranged in a first and a second row, the ties of the first row are arranged symmetrically with respect to and opposite from the ties of the second row, the holding element is connected with a first tie belonging to the first row and a second tie belonging to the second row.

17. The arrangement according to claim 16, wherein the opposing ties of the first and second rows are a given distance apart.

18. The arrangement according to claim 14, wherein the carrier strip has at least one spacer, the spacer extends to an upper or a lower holding distance, and the upper or lower holding distance is greater than a respective upper or lower distance to which the holding element extends respectively upwards or downwards from the carrier strip.

19. The arrangement according to claim 18, wherein the spacer is arranged between the two adjacent ties and the spacer is of integral construction with the carrier strip.

20. The arrangement according to claim 18, wherein the spacers of a row are constructed alternately upwards and downwards.

* * * * *